(12) United States Patent
Knowles et al.

(10) Patent No.: US 7,463,249 B2
(45) Date of Patent: Dec. 9, 2008

(54) ACOUSTIC WAVE TOUCH ACTUATED SWITCH WITH FEEDBACK

(75) Inventors: Terence J. Knowles, Barrington, IL (US); Charles F. Bremigan, III, Jarrell, TX (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 09/998,220

(22) Filed: Nov. 20, 2001

(65) Prior Publication Data

US 2002/0149570 A1  Oct. 17, 2002

Related U.S. Application Data

(63) Continuation-in-part of application No. 09/766,000, filed on Jan. 18, 2001, now abandoned.

(51) Int. Cl.
*G06F 3/043* (2006.01)

(52) U.S. Cl. ................ 345/177; 345/173; 345/179; 178/18.01

(58) Field of Classification Search ......... 345/173–179; 178/18.01, 18.03, 18.04, 19.01; 310/313 R, 310/313 B
See application file for complete search history.

(56) References Cited

U.S. PATENT DOCUMENTS

| | | | |
|---|---|---|---|
| 4,645,870 A | 2/1987 | Adler | |
| 4,700,176 A | 10/1987 | Adler | |
| 5,149,986 A | 9/1992 | Jalbert | |
| 5,177,327 A | 1/1993 | Knowles | |
| 5,451,723 A * | 9/1995 | Huang et al. | 345/177 |
| 5,573,077 A | 11/1996 | Knowles | |
| 5,673,041 A * | 9/1997 | Chatigny et al. | 341/22 |
| 5,813,280 A | 9/1998 | Johnson et al. | |
| 5,856,820 A * | 1/1999 | Weigers et al. | 345/177 |
| 5,977,867 A * | 11/1999 | Blouin | 340/407 |
| 5,986,224 A | 11/1999 | Kent | |
| 6,078,315 A | 6/2000 | Huang | |
| 6,085,576 A | 7/2000 | Sunshine et al. | |
| 6,087,599 A * | 7/2000 | Knowles | 178/18.04 |
| 6,091,406 A * | 7/2000 | Kambara et al. | 345/177 |
| 6,369,806 B1 | 4/2002 | Endo et al. | |
| 6,411,287 B1 * | 6/2002 | Scharff et al. | 345/177 |
| 6,473,075 B1 * | 10/2002 | Gomes et al. | 345/177 |
| 6,492,978 B1 * | 12/2002 | Selig et al. | 345/173 |
| 6,556,150 B1 * | 4/2003 | McLoone et al. | 341/20 |
| 6,606,081 B1 * | 8/2003 | Jaeger et al. | 345/111 |
| 2002/0126103 A1 * | 9/2002 | Knowles et al. | 345/177 |

* cited by examiner

*Primary Examiner*—Richard Hjerpe
*Assistant Examiner*—Kimnhung Nguyen
(74) *Attorney, Agent, or Firm*—McAndrews, Held & Malloy, Ltd.

(57) ABSTRACT

An acoustic wave switch includes a substrate with an acoustic wave cavity formed therein such that the mass per unit area of the acoustic cavity is greater than the mass per unit area of the substrate adjacent the cavity. A transducer is mounted on the acoustic cavity for generating an acoustic wave that is substantially trapped in the cavity. A touch on the touch surface of the acoustic wave cavity absorbs acoustic wave energy and produces a detectable change in the impedance of the transducer. Various feedback mechanisms can be employed to provide a user with a tactile, audible and/or visual response indicating actuation of the switch by a touch.

8 Claims, 12 Drawing Sheets

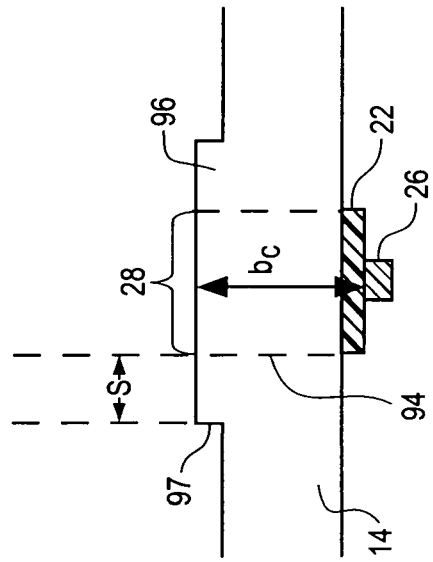
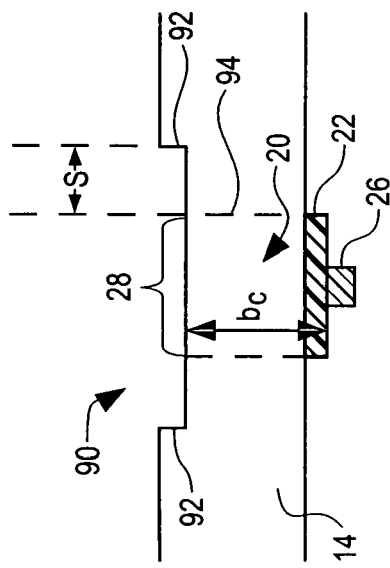
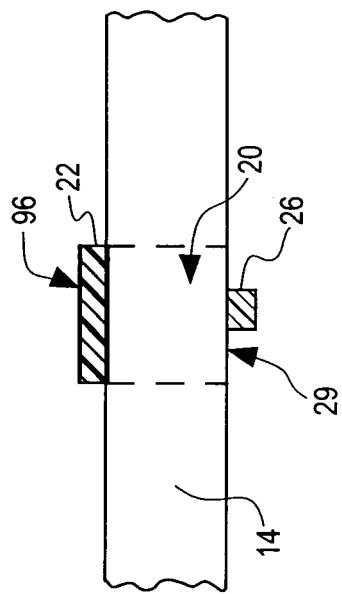
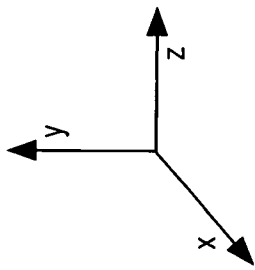

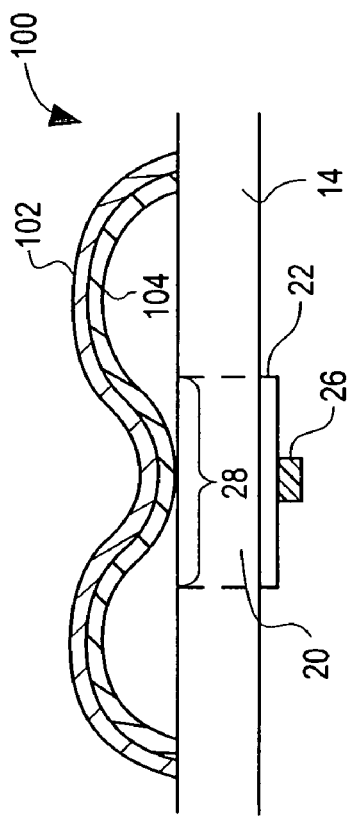
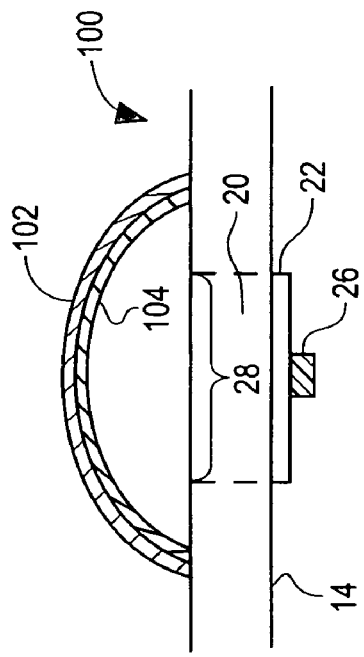
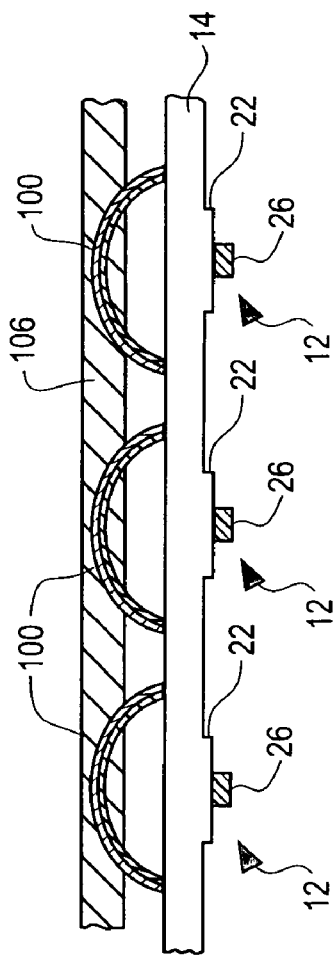

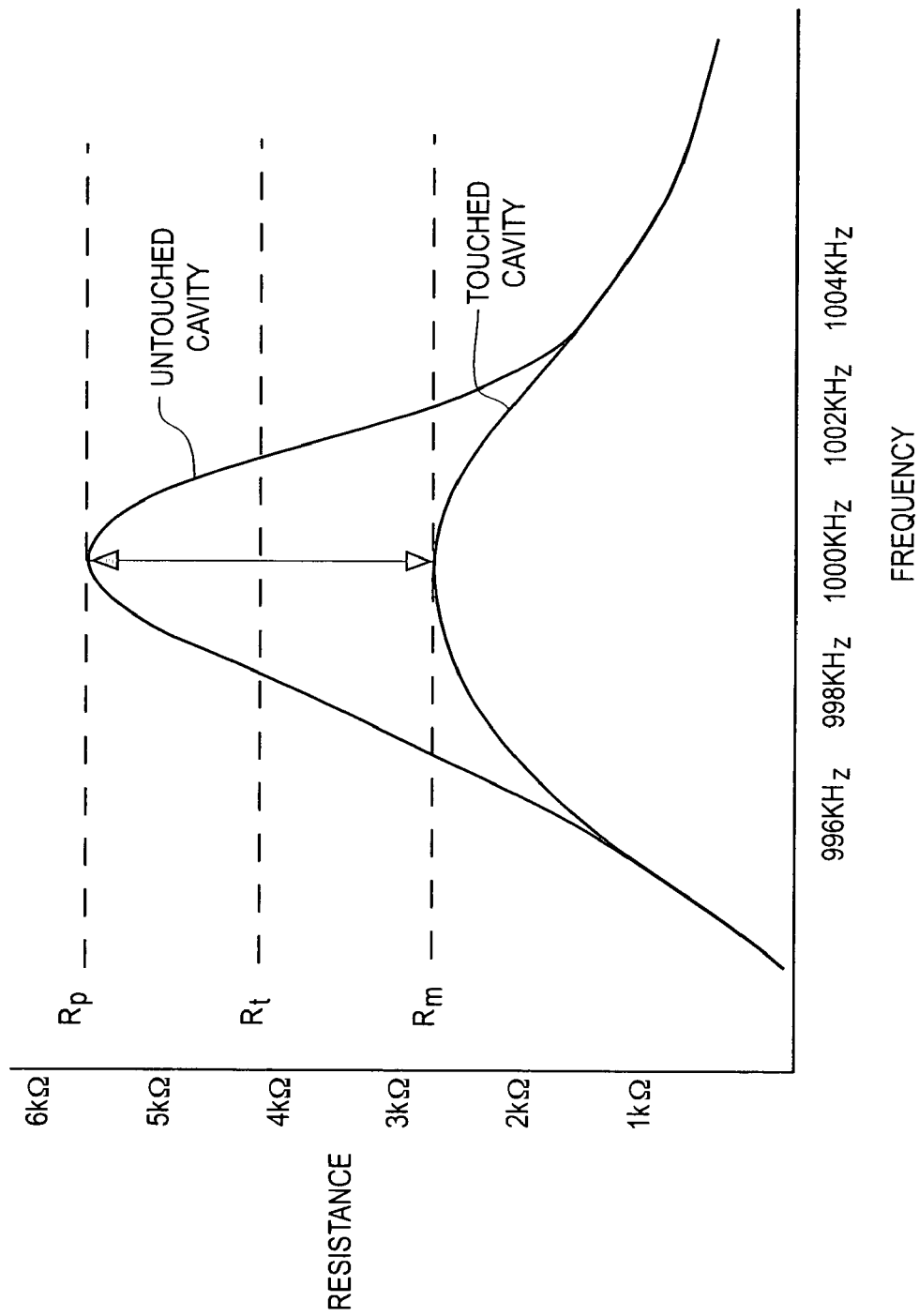

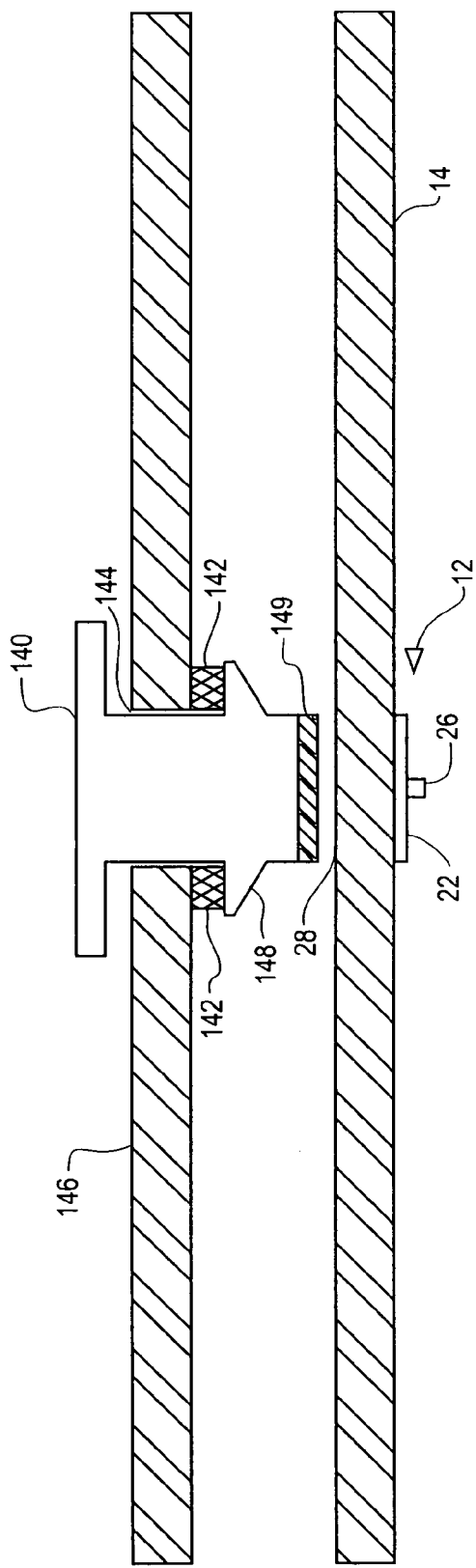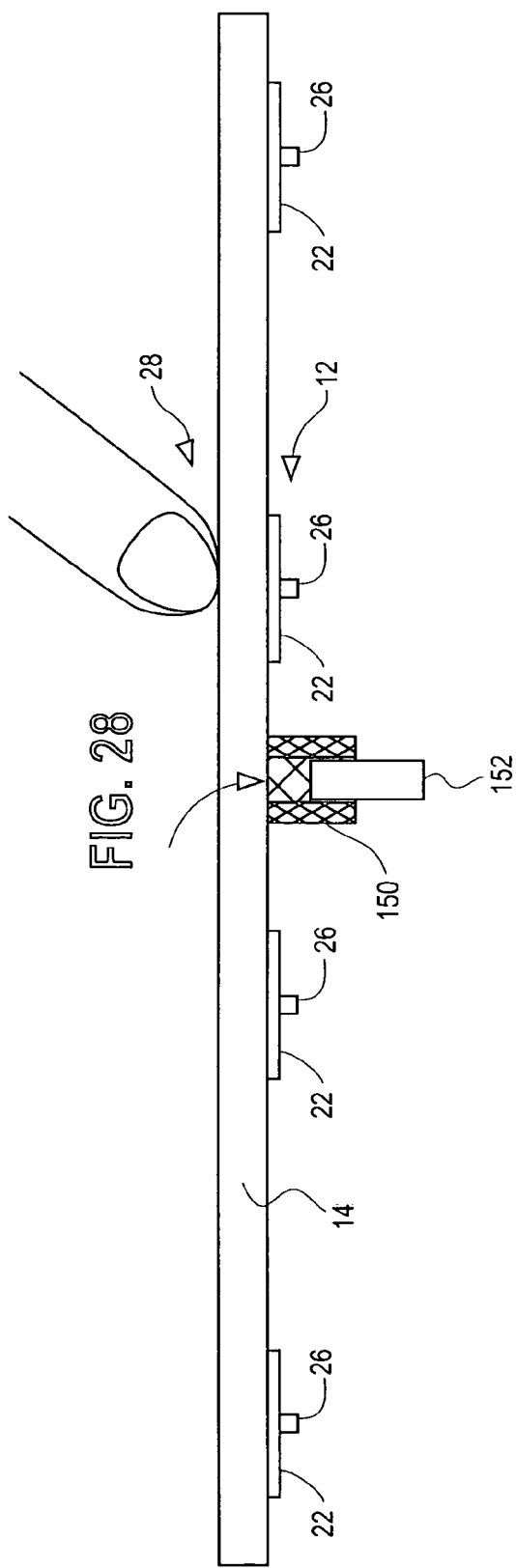

ACOUSTIC WAVE TOUCH ACTUATED SWITCH WITH FEEDBACK

CROSS REFERENCE TO RELATED APPLICATIONS

This application is a continuation-in-part of U.S. application Ser. No. 09/766,000 filed Jan. 18, 2001 now abandoned entitled ACOUSTIC WAVE TOUCH ACTUATED SWITCH.

STATEMENT REGARDING FEDERALLY SPONSORED RESEARCH OR DEVELOPMENT

N/A

FIELD OF INVENTION

The present invention relates to an acoustic wave touch actuated switch and more particularly to such a switch having an acoustic cavity that substantially traps acoustic wave energy so as to provide a high Q switch.

BACKGROUND OF THE INVENTION

There is a substantial need for finger touch actuated switches that are rugged and explosion proof, operate in the presence of liquids, have low power consumption, withstand aggressive sterilization procedures and are inexpensive. Known switches that attempt to meet these needs but fail include the following. A Qprox switch made by Quantum Research Group senses the presence of touch through a charge transfer effect. This switch is sensitive to conductive fluids and/or an ionizing atmosphere and can be made inoperable thereby. Further, the enclosure through which touch is sensed cannot be made of an electrically conducting material, so that metals and the like cannot be used. Piezoelectric switches such as supplied by Schurter or Wilson-Hurd, operate by transferring finger pressure via a metal overlay to a piezoelectric element which generates a voltage when compressed. This type of switch is expensive compared to a standard membrane switch and shares the disadvantages of membrane switches in that holes in the housing or enclosure are required to accommodate the switch. Further, the metal overlay is necessarily thin, so that the piezoelectric element is relatively unprotected against blows to the overlay. Another type of switch shown in U.S. Pat. No. 5,149,986 is based on the absorption of sound in a glass, ball-shaped button when the button is touched. In operation, a transducer sends sound waves into the glass balls and then receives back the echoes in a sonar type fashion. A circuit analyzes the echoes to determine whether the echoes have been reduced indicating a touch. This type of switch is relatively expensive and again requires openings in the housing or enclosure in which the switch is to be mounted.

An acoustic wave switch such as shown in U.S. Pat. No. 5,673,041 includes an ultrasonic piezoelectric transducer mounted on a surface of a substrate opposite a touch surface of the substrate. The transducer generates an ultrasonic wave that propagates in a direction across the thickness of the substrate to the touch surface and reflects off of the touch surface back to the transducer. The ultrasonic wave appears to be a compression wave. A touch on the touch surface changes the acoustic reflectivity of the surface and changes the impedance of the transducer. The acoustic energy in this switch is not confined and spreads out into the plane of the substrate. As such, the ratio of the stored energy to lost or dissipated energy over a complete cycle, referred to as the Q of the switch, is inherently low and an extremely complex touch detection circuit is required to discriminate between a touch and the absence of a touch. Moreover, the use of compression waves in this switch is undesirable due to their sensitivity to liquids and other contaminants which can render the switch inoperable.

Also known are acoustic wave touch panels that employ reflective gratings or arrays to reflect portions of an acoustic wave across a touch surface along parallel paths of differing lengths. These devices use a transparent substrate that can overlay a display to provide a touch screen or the like. Examples of such touch sensors are shown in U.S. Pat. Nos. 4,645,870 and 4,700,176 which utilize surface acoustic waves. These systems are undesirable, however, because surface acoustic waves are sensitive to liquids, sealing compounds and other contaminants that can render the panel inoperable and difficult to seal effectively. Another acoustic wave touch panel using reflective arrays is shown in U.S. Pat. No. 5,177,327. This touch panel uses shear waves and in particular the zeros order horizontally polarized shear wave. Although this touch position sensor is insensitive to liquids and contaminants, touch position sensors that use reflective gratings or arrays and the associated touch detection circuitry are, in general, too expensive to use for an individual switch or for a small number of switches on a panel. Moreover, because the shear wave transducer in this latter system is mounted on a side of the panel to generate a shear wave that propagates in the plane of the substrate, an opening in the enclosure or housing is required to accommodate the panel. U.S. Pat. No. 5,573,077 also uses zeros order horizontally polarized shear waves, but instead of reflective gratings, discrete transducers are used to propagate the shear waves along parallel paths extending across the substrate.

BRIEF SUMMARY OF THE INVENTION

In accordance with the present invention, the disadvantages of prior switches as discussed above have been overcome. In accordance with the present invention, acoustic wave energy is substantially trapped in an acoustic cavity so as to provide an acoustic wave switch with a high Q. Because the Q of the switch is high, a touch can be detected with extremely simple circuitry.

More particularly, the acoustic wave switch of the present invention includes a substrate with an acoustic wave cavity formed therein such that the mass per unit surface area of the acoustic cavity is greater than the mass per unit surface area of the substrate adjacent the cavity. An acoustic wave transducer is mounted on the acoustic cavity to generate an acoustic wave that is substantially trapped in the acoustic cavity. Even a light touch on a touch surface of the cavity produces a change in the impedance of the transducer that is easily detectable by a simple, low cost circuit.

In one embodiment of the switch, a thin mesa or plateau is formed on the substrate to define the acoustic cavity. Specifically, the acoustic cavity is formed of the mesa and the portion of the substrate below the mesa. The mesa may be formed on the touch surface side of the substrate or on a side of the substrate opposite the touch surface. The mesa can be an integral part of the substrate by mechanically or chemically machining the substrate. Alternatively, the mesa can be formed by adhering material to the substrate in a localized area to define the acoustic cavity. In the latter embodiment, the material forming the mesa may be the same as or a different material than the material forming the substrate. The substrate may be formed of metal, plastic, glass or ceramics, etc., capable of supporting a resonant acoustic wave. Moreover, the switch can use a wall of a housing or device enclosure as the substrate so that at least a portion of the switch, i.e. the acoustic cavity is an integral part of the housing wall. As such, no holes have to be formed in the housing or enclosure to accommodate the switch, eliminating sealing problems and providing a switch which is extremely rugged.

In a preferred embodiment, a shear wave transducer is mounted on the acoustic cavity so as to generate a shear wave in the plane of the substrate and parallel to the touch surface. The shear wave, however, has a higher order mode than the zeros order mode so that the wave can be substantially confined to or trapped in the acoustic cavity. It should be appreciated, however, that acoustic waves, capable of being substantially trapped in an acoustic cavity, other than a shear wave can be used in accordance with the present invention as well.

The acoustic wave switch of the present invention is low-cost, rugged, explosion proof, operates with simple, low-powered electronics and continues to function in the presence of ionizing environments, liquids and other contaminants. These and other objects, advantages and novel features of the present invention, as well as details of an illustrated embodiment thereof, will be more fully understood from the following description and drawings.

BRIEF DESCRIPTION OF THE SEVERAL VIEWS OF THE DRAWING

FIG. 10 is a cross-sectional view of an acoustic wave switch in accordance with the present invention having a depressed area indicating a touch region;

FIG. 11 is a cross-sectional view of an acoustic wave switch in accordance with the present invention having a raised area indicating a touch region;

FIG. 12 is an acoustic wave switch having a mesa formed on the touch surface;

FIG. 13 is a cross-sectional view of an acoustic wave switch with an acoustic wave absorbing switch actuator to provide feedback to a user that the switch has been actuated;

FIG. 14 is an illustration of the acoustic wave switch of FIG. 3 with the switch actuator in the actuated position;

FIG. 15 is an illustration of a number of acoustic wave switches of the type shown in FIG. 11 with an overlay;

FIG. 16 is a graph illustrating the change in the transducer's impedance at peak resonance, in the absence of a touch and in the presence of a touch;

FIG. 27 is a cross-sectional view of a panel such as illustrated in FIG. 2 with another embodiment of a mechanism for providing feedback to a user; and FIG. 28 a cross-sectional view of a panel such as illustrated in FIG. 1 with a further embodiment of a mechanism for providing feedback to a user.

DETAILED DESCRIPTION OF THE INVENTION

Figure 1:
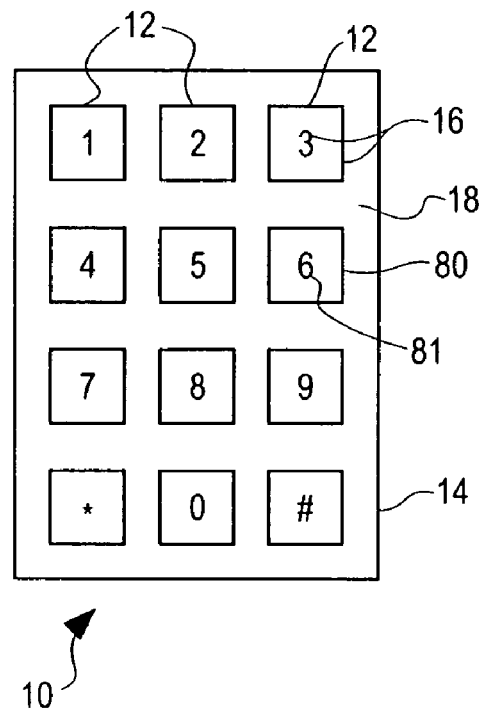
FIG. 1 is a top view of a panel having a number of acoustic wave switches formed therein in accordance with the present invention.
Figure 2:
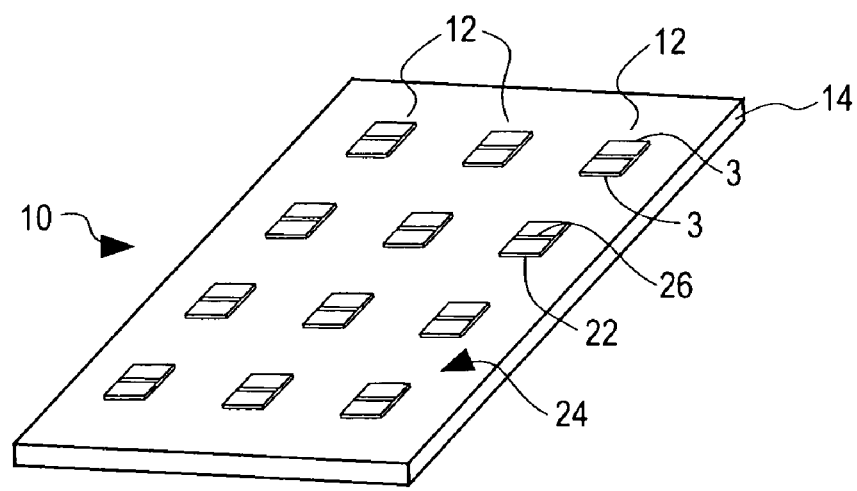
FIG. 2 is a perspective view of the back of the panel of FIG. 1 illustrating the substrate, mesas and associated transducers forming the acoustic wave switches.

A touch panel as shown in FIGS. 1 and 2 has a number of acoustic wave switches in accordance with the present invention formed in the substrate 14 of the touch panel. Each acoustic wave switch 12 has respective indicia 16 formed on a top surface 18 of the panel. The indicia 16 identifies the position of a switch 12 and a switch actuation touch surface which are centrally located in the indicia 16. The indicia 16 can be formed in a number of different ways as described in detail below.

Figure 3:
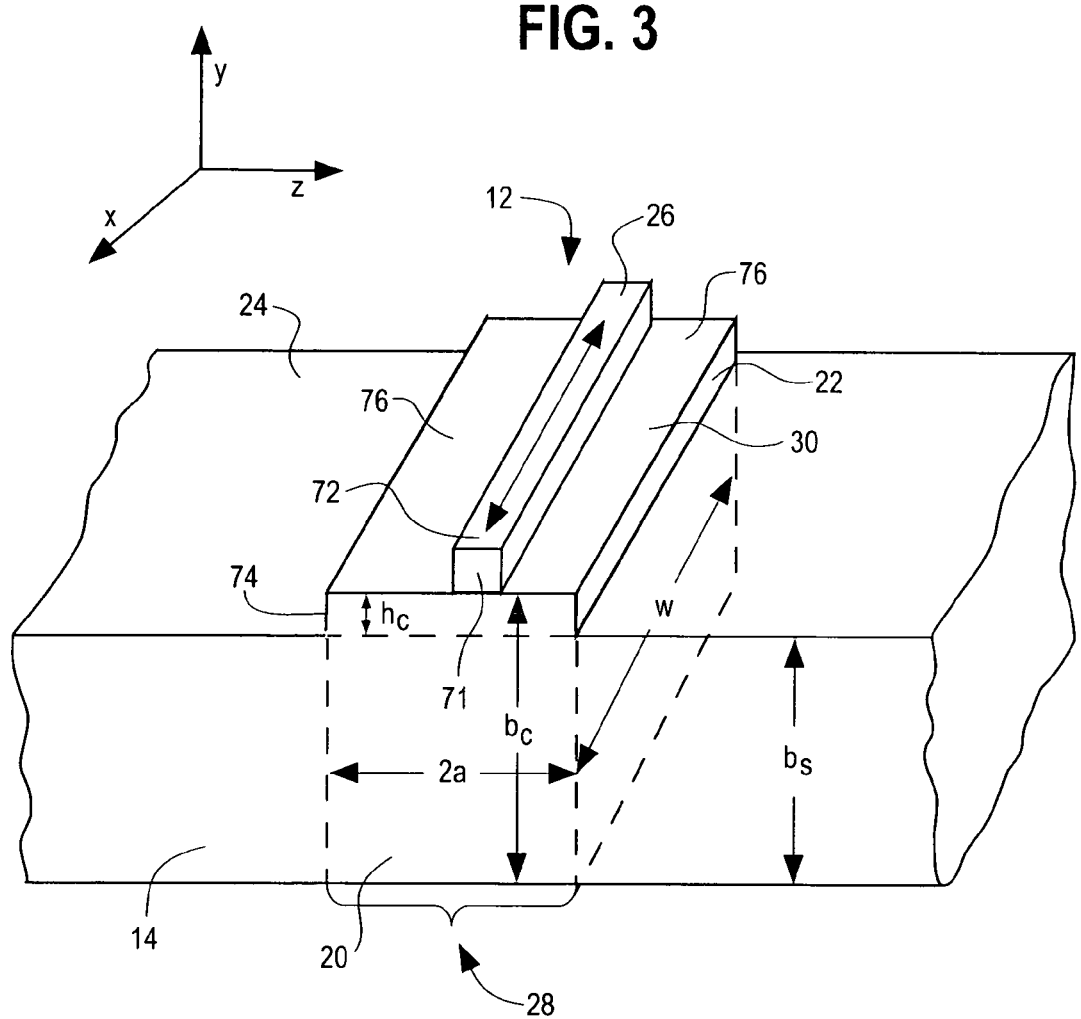
FIG. 3 is a side cross-sectional view of an acoustic wave switch of FIGS. 1 and 2 illustrating the acoustic cavity of the present invention.

As shown in FIG. 2 and in more detail in FIG. 3, each acoustic wave switch 12 has an associated acoustic wave cavity 20 that extends through the thickness $b_s$ of the substrate 14. The acoustic wave cavity 20 is formed in the substrate 14 such that the mass per unit surface area of the acoustic wave cavity 20 is greater than the mass per unit surface area of the substrate adjacent the cavity. In one embodiment, the mass per unit area of the substrate in the switch region is increased to form the acoustic wave cavity 20 by forming a thin plateau or mesa 22 on a surface of the substrate that is parallel to the plane of the substrate and/or a touch surface 28. The mesa 22 can be formed on a back surface 24 of the substrate opposite the touch surface 28 of the acoustic cavity as shown in FIG. 3. Alternatively, the mesa 22 can be formed on the switch actuation touch surface 28 as shown in FIG. 12. A transducer 26 is mounted on a surface 30 of the acoustic wave cavity 20 to generate an acoustic wave that is substantially trapped or localized in the cavity 20. Although the transducer 26 is shown in FIG. 3 as mounted on the mesa 22, if the mesa 22 is formed on the touch surface 28 of the substrate, the transducer 26 is mounted directly on the substrate surface 29 of the acoustic cavity opposite the mesa as shown in FIG. 12 so that the transducer is on the backside of the substrate.

The acoustic wave switch 12 of the present invention can use any type of acoustic wave capable of being substantially trapped in an acoustic wave cavity. For simplicity, the switch 12 will be described for a preferred embodiment that uses a shear wave in a direction that is in the plane of the substrate, wherein the shear wave energy extends in a direction perpendicular to the substrate plane, i.e. through the thickness of the substrate. A shear wave is advantageous because it is insensitive to liquids and other contaminants on the touch surface 28 of the switch 12. Because the fundamental or zeros order mode of a horizontally polarized shear wave cannot be substantially trapped, higher order shear wave modes are used in accordance with the present invention. It should be appreciated that because the acoustic wave used in accordance with the present invention is trapped, the wave is a standing wave. A standing wave has a number of advantages over an acoustic wave that propagates or travels along a path in a substrate. For example, propagating waves are not confined to the main path of propagation but can diffract off of the main path complicating touch detection. This is opposed to a standing wave which by its nature is confined to the area of the cavity. Because the acoustic wave is confined, touch detection is easily accomplished. Further, the wave energy of a propagating wave is not stored at any location along the path. Once the wave passes a point along the path, the wave is gone. this makes timing and control critical for touch detection with propagating waves. There are no timing or control issues with a standing wave because the wave energy is stored in the cavity. Moreover, a propagating wave is not a resonating wave. As such, the wave energy decays at it travels. A standing wave is resonant so that the wave is reinforced and prolonged. As a result, the standing wave has a much greater amplitude than a wave that is not confined.

For a shear wave generated by the transducer 26 and having a harmonic mode, n greater than or equal to 1, the thickness of the cavity $b_c$ should be greater than ½ λ, where λ is the wavelength of the fundamental, zeros order mode. For shear waves having a harmonic mode of n≧1, separate cutoff frequencies exist for the acoustic cavity 20 and the adjacent region of the substrate. These cutoff frequencies, designated $f_c$ and $f_s$ respectively, determine the frequency range in which standing waves, and hence resonance, is possible. For wave frequencies below $f_c$, no waves propagate. For wave frequencies between $f_c$ and $f_s$, standing waves can form because of reflections at the acoustic cavity boundaries. At wave frequencies above $f_s$, the waves will not be substantially trapped within the acoustic cavity 20 and will propagate throughout the substrate 14. Thus, at frequencies above $f_s$, resonance in the acoustic cavity 20 is suppressed due to substantial leakage of acoustic energy into the surrounding areas in the substrate 14. The cut-off frequencies $f_c$ and $f_s$ are given by the following formulas.

$$f_c = \frac{nV_s}{2b_c} \quad f_s = \frac{nV_c}{2b_s}$$

Where $b_c$ is the thickness of the acoustic cavity 20; $b_s$ is the substrate thickness in the area adjacent the acoustic cavity; $V_s$ is the velocity of the zeros order mode shear wave in the substrate; $V_c$ is the velocity of the zeros order mode shear wave in the cavity and n is the order of the harmonic mode of the generated shear.

In a preferred embodiment, the cavity 20 is operated in only a single mode. To accomplish this in practice, the geometry of the acoustic cavity 20 is such that the ratio of the length to thickness of the cavity satisfies the following equation where the length is designated as 2a.

$$\frac{2a}{b_c} \leq \frac{1}{n}\sqrt{\frac{2b_s}{h_c}}$$

Where $h_c$ is the height of the mesa 22, i.e. $h_c = b_c - b_s$. Similarly, the width w, of the acoustic cavity should satisfy the same relationship as follows.

$$\frac{w}{b_c} \leq \frac{1}{n}\sqrt{\frac{2b_s}{h_c}}$$

Further, the transducer 26 is positioned along a center line of the cavity.

Figure 4:
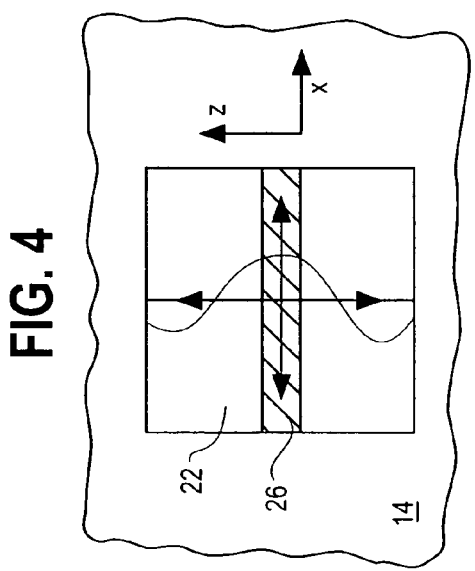
FIG. 4 is a top view of the acoustic wave switch of FIG. 3 illustrating the displacement of the transducer and the direction of propagation of a shear wave in the plane of the substrate.
Figure 6:
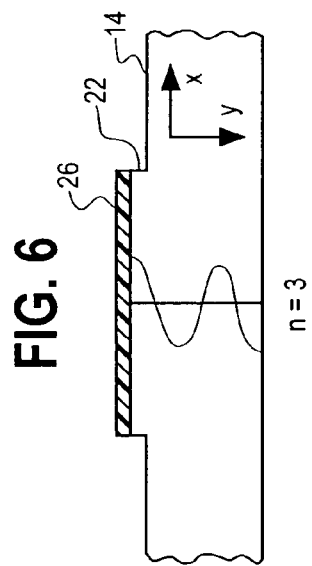
FIG. 6 is a side cross-sectional view of the acoustic wave switch illustrating the displacement of a third order mode shear wave in the y-x plane.
Figure 7:
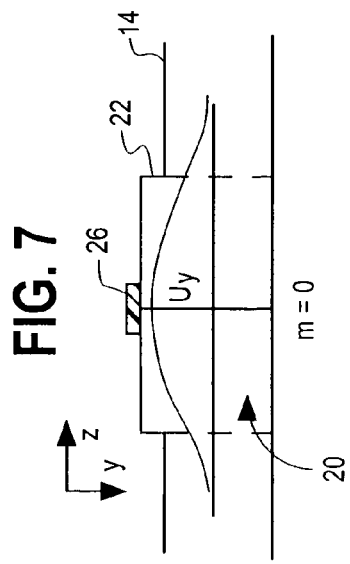
FIG. 7 is a cross-sectional view of the acoustic wave switch illustrating the displacement of a shear wave having m=0 in the y-z plane.
Figure 8:
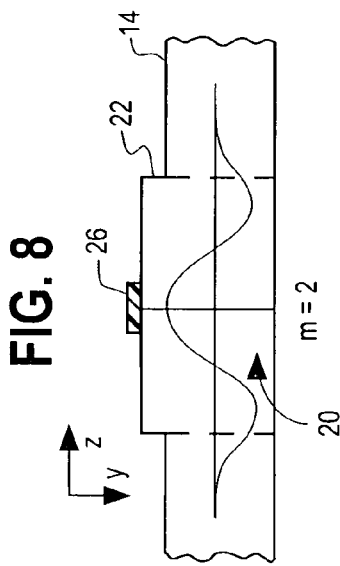
FIG. 8 is a cross-sectional view of the acoustic wave switch illustrating the displacement of a shear wave having m=2 in the y-z plane.
Figure 5:
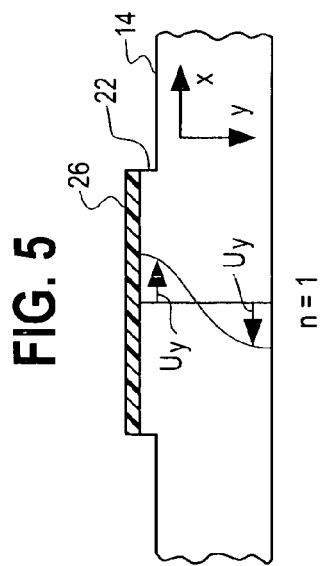
FIG. 5 is a side cross-sectional view of the acoustic wave switch illustrating the displacement of a first order mode shear wave in the y-x plane.

FIGS. 4-7 illustrate the peak displacement of the wave motion in the acoustic cavity for a transducer 26 that is mounted on the acoustic cavity such that the length of the transducer 26 extends along a center line of the acoustic cavity surface in the X direction. In particular, as seen in FIG. 4 for a shear wave transducer having displacement in the X direction, the shear wave generated in the acoustic cavity propagates in a direction that is in the plane of the substrate (the X-Z plane) as opposed to across the thickness thereof. The shear wave has a displacement component in the y direction designated $U_y$, which is illustrated in FIG. 5 for the harmonic mode, n=1 and in FIG. 6 for the harmonic mode n=3. It has been found that a harmonic mode of order n=1 is preferred for thin substrates 14 whereas the harmonic mode n≧3 is preferred for thicker substrates. FIG. 7 illustrates the peak displacement of the wave in the y-z plane for an inharmonic mode of m=0; whereas FIG. 8 illustrates the peak displacement of the wave in the y-z plane for an inharmonic mode of m=2.

It should be appreciated that the cavity may also be operated in more than one mode in accordance with the present invention. Further, the transducer need not be placed along a centerline of the cavity. For example, the transducer may be placed on the cavity adjacent to an edge thereof. The transducer may also be placed on the cavity but spaced from an edge thereof. The distance from the transducer to the cavity edge can be chosen to selectively cancel modes.

The acoustic wave cavity of the present invention has a high Q such as on the order of 400. The amount of energy absorbed by touching the surface 28 of the acoustic cavity in the 1-5 MHz range is not particularly frequency sensitive. A light touch on the surface 28 reduces the Q by a factor of 2.5, i.e. from 400 to 160. As such, by incorporating the transducer into a very basic and simple circuit, a touch on the acoustic cavity touch surface 28 can be easily detected so as to generate a signal indicating actuation of the switch. As can be seen in FIG. 16, a touch on the surface 28 of the acoustic cavity absorbs acoustic energy therein resulting in an easily detectable drop in impedance. For an untouched panel, the impedance of the transducer is at a peak, $R_p$. In the presence of a touch, the impedance of the transducer drops to a level $R_m$. below a threshold $R_t$ that can be set as discussed below. By incorporating the transducer 26 into an oscillator circuit as described below with reference to FIG. 9, the drop in impedance indicating a touch can be readily detected. In the absence of touch, the circuit oscillates and in the presence of a touch, oscillation stops. By detecting the state of oscillation, a signal is generated indicating the occurrence of a touch actuating the switch 12.

Figure 9:
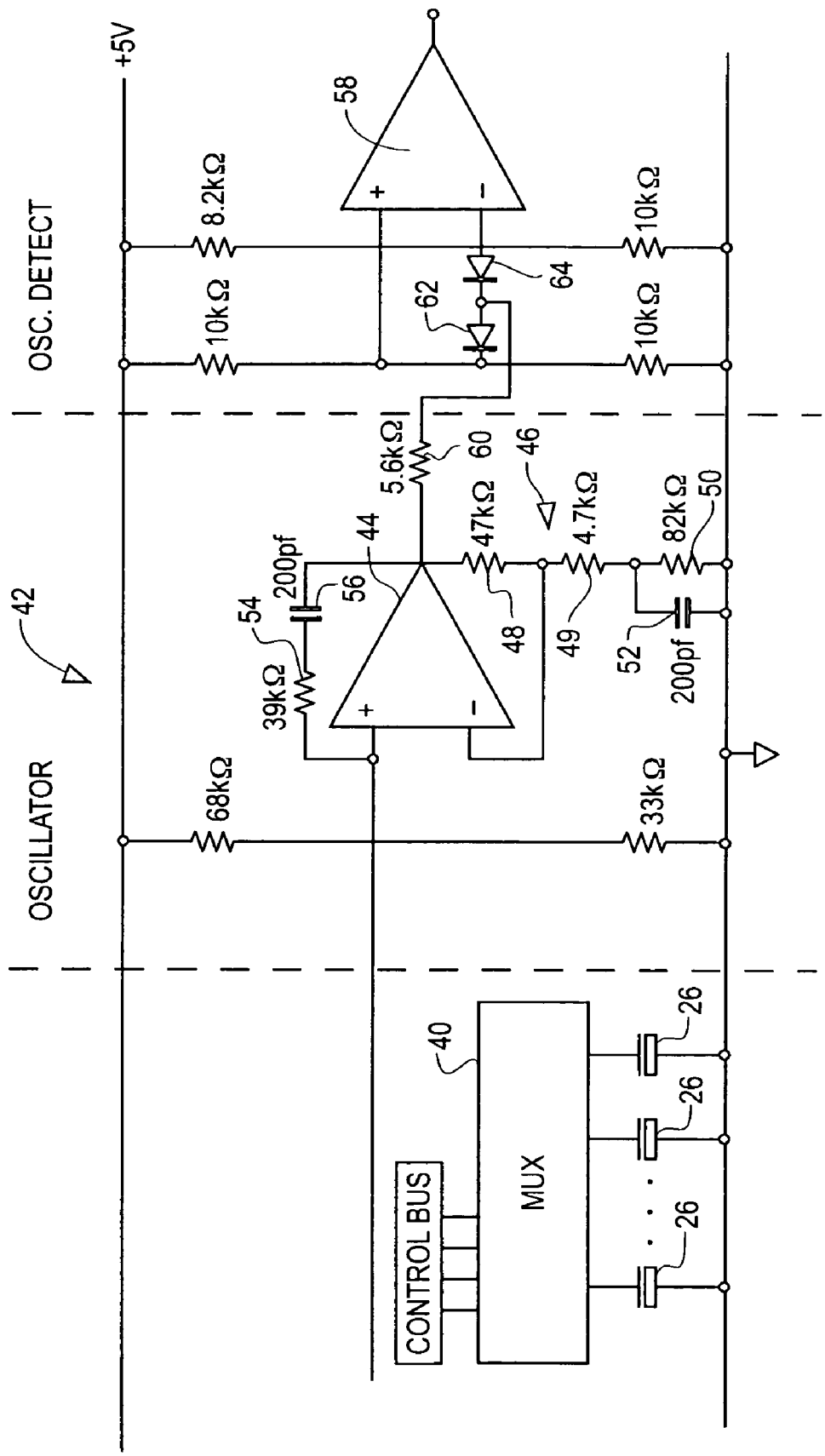
FIG. 9 is a schematic diagram of a touch detection circuit for the acoustic wave switch of FIGS. 1-3.

FIG. 9 is a diagram of an extremely simple touch detection circuit for a panel 10 having a number of acoustic wave switches 12. Each transducer 26 associated with a respective acoustic switch 12 is coupled to a multiplexer 40 which sequentially couples a transducer and therefore its associated acoustic switch 12 to an oscillator 42. The oscillator 42 includes an operational amplifier 44 having a gain-bandwidth product of 60 MHz. The operational amplifier 44 has two feedback paths. The feedback path 46 connected from the output of the operational amplifier 44 to the negative input terminal thereof sets the static voltage gain to approximately 1.5 through a 47 kΩ resistor 48, a 4.7 kΩ resistor 49 and an 82 kΩ resistor 50. The voltage gain at resonant frequency is approximately 11 because the resistor 50 is bypassed by the 200 pf capacitor 52. The second feedback path of the operational amplifier 44 connects the output thereof to the positive input terminal of the operational amplifier 44 via a 39 kΩ resistor 54 and a 200 pf capacitor 56. The amplifier 44 is connected to a second operational amplifier 58 that detects the state of the oscillator 42 through a 5.6 kΩ resistor 60 and a pair of diodes 62 and 64.

It can be assumed that the transducer impedance is purely resistive at anti-resonance. With this assumption, the value of the resistor 54 is chosen such that a voltage that exceeds $1/A_v$ of the output, where $A_v$ is the gain of the oscillator at resonant frequency (in this case $A_v=11$), is fed back to the positive terminal of the operational amplifier 44. Under this condition, the operational amplifier 44 will oscillate. If the resistance of the transducer 26 coupled to the operational amplifier 44 is designated $R_p$ and resistor 54 is designated as $R_f$ then the condition for oscillation is as follows.

$$\frac{R_f}{R_p} \le (A_v - 1)$$

More particularly, the value of the resistor 54, $R_f$, is selected such that the acoustic cavity 20 will cause the oscillator 42 to oscillate in the absence of a touch. A touch on the surface 28 of the acoustic cavity 20 will cause the transducer impedance to drop so that the oscillator 42 stops oscillating. The operational amplifier 58 is biased so that the input level matches the quiescent output of the oscillator circuit 44 with diodes D1 and D2 acting as threshold switches. When the operational amplifier 44 is oscillating, the operation amplifier 58 has a high output whereas in the quiescent condition the output of the operational amplifier 58 is low or zero. Thus, the operational amplifier 58 generates a low or zero signal in the presence of a touch and in the absence of a touch the output is high. It should be appreciated that touch detection circuits other than as depicted in FIG. 9 may be used in accordance with the present invention as well.

In a preferred embodiment, the transducer 26 is mounted on a surface of the acoustic touch panel such that the surfaces 71 and 72 of the transducer 26, across which a voltage is applied to excite the transducer, are parallel to the plane of the substrate 14 and/or the plane of the touch surface 28 of the acoustic cavity 20. It has been found that mounting the shear transducer in this manner generates a shear wave having a harmonic mode with $n \ge 1$ without generating the fundamental or zeros order mode of the shear wave. This is opposed to the manner in which shear wave transducers are typically mounted on a substrate to generate a shear wave in the plane of the substrate. The typical arrangement mounts the transducer such that the surfaces across which the voltage is applied to excite the transducer are perpendicular to the plane of the substrate and touch surface, for example on a side of the substrate as opposed to the top or the bottom of the substrate as in the present invention. It has been found, however, that shear waves of higher order modes, i.e. $n \ge 1$, will be generated in the plane of the substrate, as depicted in FIG. 4, without generating a substantial fundamental mode shear wave by mounting the transducer such that the surfaces 71 and 72 thereof are parallel to the plane of the substrate and/or touch surface. It should be appreciated, however, that other mounting positions of the transducer 26 will generate the desired higher order modes of the shear wave without generating a substantial fundamental shear wave mode. For example, the transducer 26 may be mounted on a side 74 of the mesa where the side is appropriately angled so that it is not perpendicular to the plane of the substrate. This mounting method will work but results in a more complicated manufacturing process for the acoustic wave switch 10.

Further, although it is preferred that the transducer be mounted along a center line of a surface of the acoustic wave cavity as discussed above, the acoustic wave switch 12 will work for other transducer mounting positions, for example, on surface 30 but adjacent an edge 76 thereof. The preferred shear wave transducer materials are Lead Zirconium, Titanate (PZT) types and specifically PZT4D, PZT5A and PZT8 supplied, for example, by Morgan Matroc Transducer Products Ltd. These transducers are preferred due to their combination of high coupling factors, low acoustic and electrical losses and impedance levels.

For most switch applications, the acoustic wave cavities 20 operate between 1 and 3 MHz so that the minimum wavelength is approximately 40 mils. At these wavelengths, bonding of the transducer is not a particularly critical element because standard assembly procedures produce bond lines that are less than 0.2 mil thick. The adhesive, typically an epoxy that is operable over a wide temperature range, should be fairly rigid to reduce acoustic wave losses and provide bond shear strengths high enough to tolerate stresses at the epoxy interfaces due to differential thermal expansion rates between the material of the transducer 26 and the material of the substrate 14 or mesa 22 onto which the transducer is mounted. A conducting epoxy is not necessary. It has been found that reliable, low impedance bonds do not require a conducting epoxy. This is advantageous because most conducting epoxies have greater acoustic losses than non-conducting epoxies. A suitable epoxy is, for example, Epotek 301 and 301-2 manufactured by Epotek Corporation which operate over a temperature range of at least −40° C. to 85° C.

A number of different methods can be used for connecting the transducer 26 to the touch detection circuit. For example, wires can be soldered onto the transducer. If this method is used, the amount of solder on the transducer should be minimized since solder is a significant absorber of acoustic energy and will reduce the Q of the switch 12. Further, the wire should be aligned along the transducer in the shear direction to minimize wire flex which can be a source of acoustic losses. A preferred method uses a "Zebra Strip" manufactured by FujiPoly America Corporation Series 5000 silver zebra connector for example. The zebra connector is a rubbery material that conducts current in the thickness direction. In accordance with this method, the zebra connector is interposed between the transducer 26 and conductive pads formed in the conductor board for the touch detection circuitry such that the pads are aligned with the transducer. When vertical pressure is applied, a connection is formed between the transducer and the pads via the zebra strip connector. In this method, the printed circuit board may be directly mounted over the mesa 22. In a further embodiment, conducting silicones are used to connect the transducer 26 to the touch detection circuitry.

The substrate and thus the acoustic wave cavity can be formed of any material such as metal, plastic, glass, ceramic, etc., in which an acoustic wave can propagate. If the substrate on which the transducer is mounted is metal, it has been found that an electrical lead does not need to be formed on the bottom surface 71 of the transducer in order to connect the transducer to ground. The bonding layer between the transducer 26 and the surface of the acoustic wave cavity is so thin that the transducer can be connected to ground via the metal surface on which the transducer is mounted.

The mesas 22 can be formed integrally with the substrate as shown in FIG. 3 by mechanical machining or chemical processing such as milling, die-casting, stamping, sandblasting or etching, etc., the substrate to form the raised area of the mesa 22 having a greater mass per unit area than the adjacent area of the substrate surrounding the mesa. Alternatively, as shown in FIGS. 10-12, the mesa 22 can be formed by adding a material in a localized area defining the length and width of the acoustic cavity. The material may be added to the substrate to form the mesa by plating, thick film screening or firing frit or the like onto the substrate. Small decals may also be adhered to the substrate to very inexpensively form the mesas 22. The material forming the mesa in this embodiment can be the same as or different than the material forming the substrate 14. For transparent substrate materials, the mesas 22 can be formed with decals of a contrasting color and bearing indicia to identify a particular switch, i.e. touch position. The thickness or height $h_c$ of the mesa 22 is very thin. For example, a ⅟₁₆ of an inch thick aluminum plate having a typical shear wave velocity of 124.5 mils per microsecond has a cavity cutoff frequency that is very close to 1 MHz. Mesas step heights $h_c$ of 3 mils ±1 mil can readily be machined, stamped, sandblasted or the like into the aluminum. In general, it is desirable to keep the mesa height $h_c$ as low as possible even if the ratios of cavity length to cavity thickness and cavity width to cavity thickness satisfy the above described cavity geometry conditions. This is because those equations assume that the boundary conditions across the cavity-substrate boundary can be matched with a single antisymmetric mode. In practice, this cannot be accomplished and some fundamental mode energy is generated which cannot be trapped. As such, the mesa height or step height should be minimized. In practice, it is desired that the mesa height $h_c$ be less than or equal to 10% of the acoustic cavity thickness and preferably $h_c$ is less than or equal to 5% of the acoustic cavity thickness. Along with the length and width requirements of the cavity, the height requirement of the mesa provides satisfactory conditions for operation in substantially a single mode trapped resonance.

Figure 17:
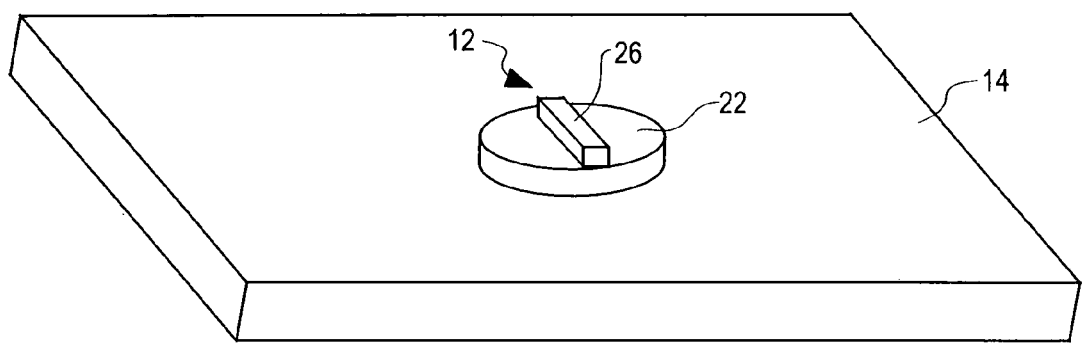
FIG. 17 is a perspective view of the acoustic wave switch with a circular mesa.
Figure 18:
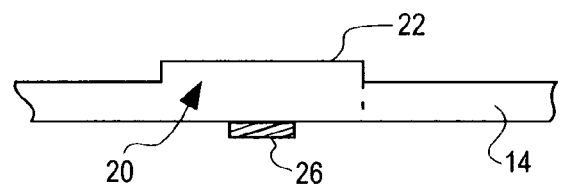
FIG. 18 is a cross-sectional view of the acoustic wave switch of FIG. 17 with the transducer mounted on a surface of the substrate opposite the circular mesa.
Figure 19:
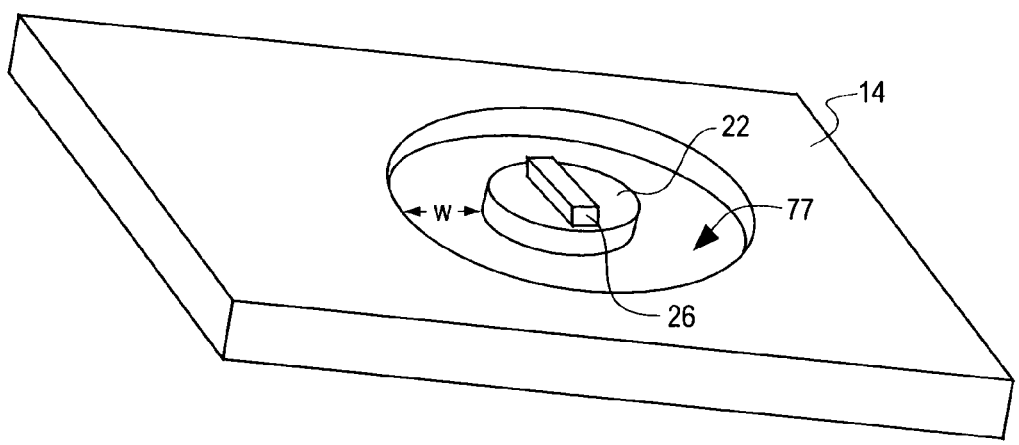
FIG. 19 is a perspective view of the acoustic wave switch with a circular mesa defined by a moat in the substrate.
Figure 20:
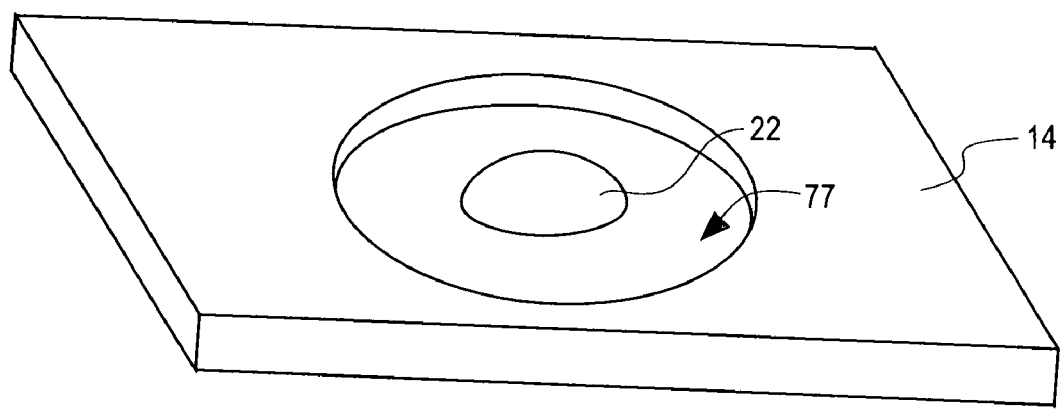
FIG. 20 is a perspective view of the acoustic wave switch with a dome shaped mesa surrounded by a moat in the substrate.
Figure 21:
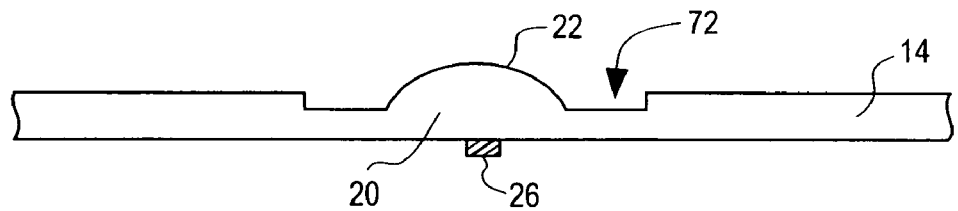
FIG. 21 is a cross-sectional view of the acoustic wave switch of FIG. 20 illustrating the transducer on a surface of the substrate opposite the dome.

Although the mesa 22 shown in the drawings of FIGS. 2-8 and 10-15 is depicted as rectangular, resulting in a rectangular cavity, other shapes can be used as well. For example, FIGS. 17-19 illustrate circular mesas and FIGS. 20-21 illustrate a dome mesa. For an acoustic wave switch 12 with a circular mesa 22 as shown in FIGS. 17-19, the transducer 26 is preferably placed along a diameter of the circular mesa in any orientation. For a circular mesa, the transducer 26 need not extend across the entire width of the mesa so that the transducer length can be less than the mesa width or diameter. Preferably, however, the ratio of transducer length to mesa diameter is 67% or greater. The transducer 26 can be positioned on the circular mesa as shown in FIGS. 17 and 19. Alternatively, the transducer 26 can be positioned on a surface opposite the circular mesa 22 as shown in FIG. 18. In this embodiment, the mesa 22 identifies the switch position. Because the mesa 22 is circular, it more closely matches the contact area of a finger than other mesa shapes. Further, because the circular mesa is isoperimetric, i.e. the largest area is enclosed for a given perimeter length, a greater packing density can be achieved than with mesas of other shapes.

FIGS. 19 and 20 illustrate mesas 22 that are formed by removing material from the substrate so as to form a moat 77 surrounding the mesa 22. In order to acoustically isolate the mesa 22 defined by a moat 77, the moat width is preferably greater than or equal to 2 times the thickness of the acoustic cavity 20 or greater than or equal to the wavelength $\lambda$ of the acoustic wave that is trapped in the cavity 20. It should be appreciated that the moat 77 may define mesas of shapes other than circular such as rectangular, square, etc. as well.

FIGS. 20 and 21 illustrate a convex or dome shaped mesa 22. The convex mesa forms a tactile switch without moving parts. Moreover, because the boundary of the acoustic cavity is defined by a gradual slope as opposed to an abrupt edge, the acoustic switch is more tolerant of transducer misalignment. The mesa 22 of FIGS. 20 and 21 is formed by removing material from the substrate to form the moat 77 and to contour the shape of the convex mesa 22. In this embodiment, the transducer is preferably mounted on a flat surface of the acoustic cavity, i.e. on the substrate surface opposite the dome 22 as shown in FIG. 21. It should be apparent that the dome shaped mesa 22 need not be surrounded by a moat.

The size of the acoustic cavity 20 defined by the length and width or the diameter thereof can be much smaller than the area identified by the indicia 16 indicating the position of a switch 12 so as to minimize the size of the transducer 26 and thus reduce the cost of the acoustic wave switch 12. It has been found that a finger does not have to completely cover the touch surface 28 of the acoustic cavity 20 in order to absorb sufficient amount of energy to be easily detected.

Various methods can be used to indicate the position of the switch 12. The indicia 16 indicating the position of the switch 12 can be formed with polyurethane paint. These paints do not drastically reduce the Q of the cavity. For a metal substrate 14 such as aluminum, anodization can provide striking contrasts. The coating is essentially aluminum oxide with a dye incorporated into the oxide via additives in an anodization bath. This method creates rugged indicia. Other methods that can be employed to create the indicia to identify the switch position are laser, mechanical or chemical engraving. With this method, an outline 80 of the switch position is preferably formed in an area outside of the acoustic cavity. Although the numeral indicia 81 is at least in part formed in the touch surface 28 of the acoustic cavity 20 the removal of the slight amount of mass to form the numeral indicia 81 does not effect the operation of the acoustic cavity 20. For glass and ceramic substrates 12, the indicia identifying the switch position can be painted on the substrate. In the case of glass and other transparent substrates, the indicia can be formed on the back surface of the substrate opposite the touch surface so that a coating providing the indicia is not exposed. The switch positions can also be identified by either a depressed or raised region formed in the substrate as discussed below.

As shown in FIG. 10, the indicia identifying the position of the switch 12 is a depressed region 90. The touch responsive surface 28 of the acoustic wave cavity 20 is generally centered in the depressed region 90. Because in practice, not all of the acoustic wave energy will be trapped within the cavity 20, it is preferred that the walls 92 of the depressed region be spaced from the walls 94 of the acoustic cavity 20 by a distance that is greater than or equal to $0.6\, b_c/n$. As can be seen from FIG. 10, with this minimum spacing, even though the thickness of the substrate outside of the depressed region is greater than the thickness of the acoustic cavity 20, the acoustic cavity 20 still has a mass per unit area greater than that of the substrate 14 adjacent to the cavity so as to enable the acoustic wave energy to be substantially trapped in the cavity 20. In FIG. 11, the indicia identifying the switch position 12 is a raised region 96. Again in this embodiment, the side wall 97 of the raised region 96 should be spaced a distance from the edge 94 of the acoustic cavity 20 by a distance that is greater than or equal to $0.6\, b_c/n$ so as to prevent leaked acoustic energy at the edge 97 from effecting the operation of the cavity 20. In the embodiment in FIG. 12, the raised surface 96 indicating the position of the switch 12 also forms the mesa 22 with the transducer 12 mounted directly on the back surface 29 of the acoustic cavity 20 and substrate 14. In this embodiment, the minimum spacing between the edge of one mesa 22 and an adjacent mesa is $0.6\, b_c/n$.

Feedback to the user that the switch 12 has been actuated can be provided by a number of different methods. For example, the detection circuitry can actuate a beeper or the like to provide sound feedback to the user that a touch has actuated the switch 12. Alternatively, the circuit can actuate a light or the like to provide visual feedback. Tactile and audible feedback can be provided in accordance with the embodiments depicted in FIGS. 13-15. In this embodiment, an acoustic wave absorbing switch actuator 100 is positioned over the touch surface 28. The switch actuator 100 is formed of a metal or plastic dome 102 or the like with an acoustic wave absorbing material or coating 104 on the inner surface thereof. The acoustic wave absorbing material 104 may be a urethane rubber or the like. When the actuator 100 is depressed by a finger as depicted in FIG. 14, the acoustic wave absorbing material 104 touches the touch surface 28 of the switch 12 so as to actuate the switch. Tactile feedback is provided when the touch surface 28 is contacted by the switch actuator 100. Further, when the dome deforms, a clicking sound may be produced to provide an audible feedback. An overlay 106, as depicted in FIG. 15, and formed of silicone rubber or the like can be positioned over the switch actuators 100 to provide a smooth top surface.

Figure 22:
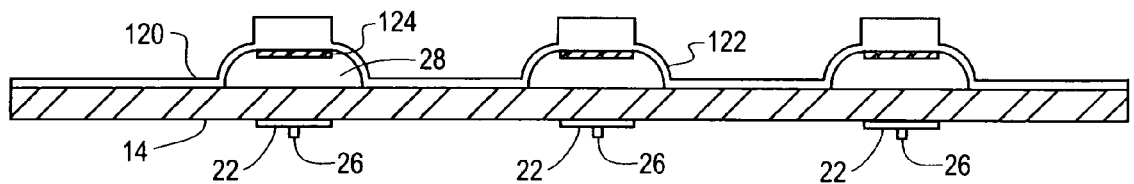
FIG. 22 is a cross-sectional view of a panel such as illustrated in FIG. 2 with a mechanism for providing feedback to a user.
Figure 23:
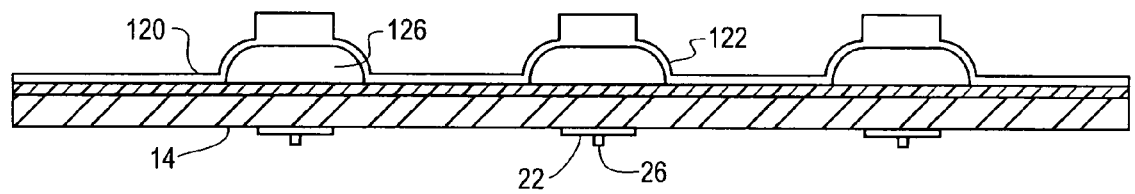
FIG. 23 is a cross-sectional view of a panel such as illustrated in FIG. 2 with another embodiment of a mechanism for providing feedback to a user.
Figure 24:
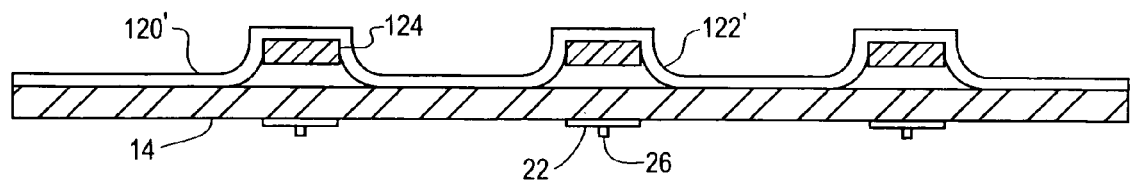
FIG. 24 is a cross-sectional view of a panel such as illustrated in FIG. 2 with a further embodiment of a mechanism for providing feedback to a user.
Figure 25:
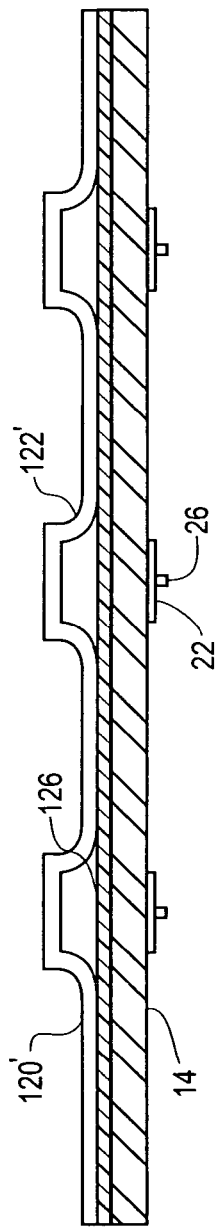
FIG. 25 is a cross-sectional view of a panel such as illustrated in FIG. 2 with still another embodiment of a mechanism for providing feedback to a user.

FIGS. 22-25 illustrate alternative embodiments for providing feedback to the user that the switch has been actuated. In FIGS. 22 and 23, a polymer sheet 120 which may be made, for example of a molded silicone, overlays the substrate 14. The sheet 120 is molded with domes 122 formed therein. The domes 122 are positioned on the sheet 120 so that each dome is above a respective acoustic switch formed by the mesa 22 and transducer 26 on a substrate surface opposite the sheet 120. An acoustic wave absorbing material 124 as shown in FIG. 22 is mounted or coated on the concave surface of the dome facing the touch surface 28 of the switch so that when the dome is depressed the acoustic wave absorber 124 contacts the touch surface 28 of the switch. In FIG. 23, instead of an individual acoustic wave absorber 124 associated with each dome 122, a sheet of acoustic wave absorbing material directly overlays the substrate 14 and is disposed between the substrate 14 and the polymer sheet 120 with molded domes. When an individual dome is pressed, exerting a force or pressure on an area of the absorbing sheet 120 overlaying the acoustic cavity, the impedance of the transducer changes indicating actuation of the switch. FIGS. 24 and 25 illustrate different embodiments similar to FIGS. 22 and 23 respectively, but the sheet 120' is formed of metal with truncated domes 122' stamped therein. When the domes 122' are depressed actuating the switch, the domes click providing audible as well as tactile feedback. It is noted that the acoustic absorber 124 of FIGS. 22 and 24 may be a polymer with embedded magnetic particles to further aid in providing an audible click and tactile feedback.

Figure 26:
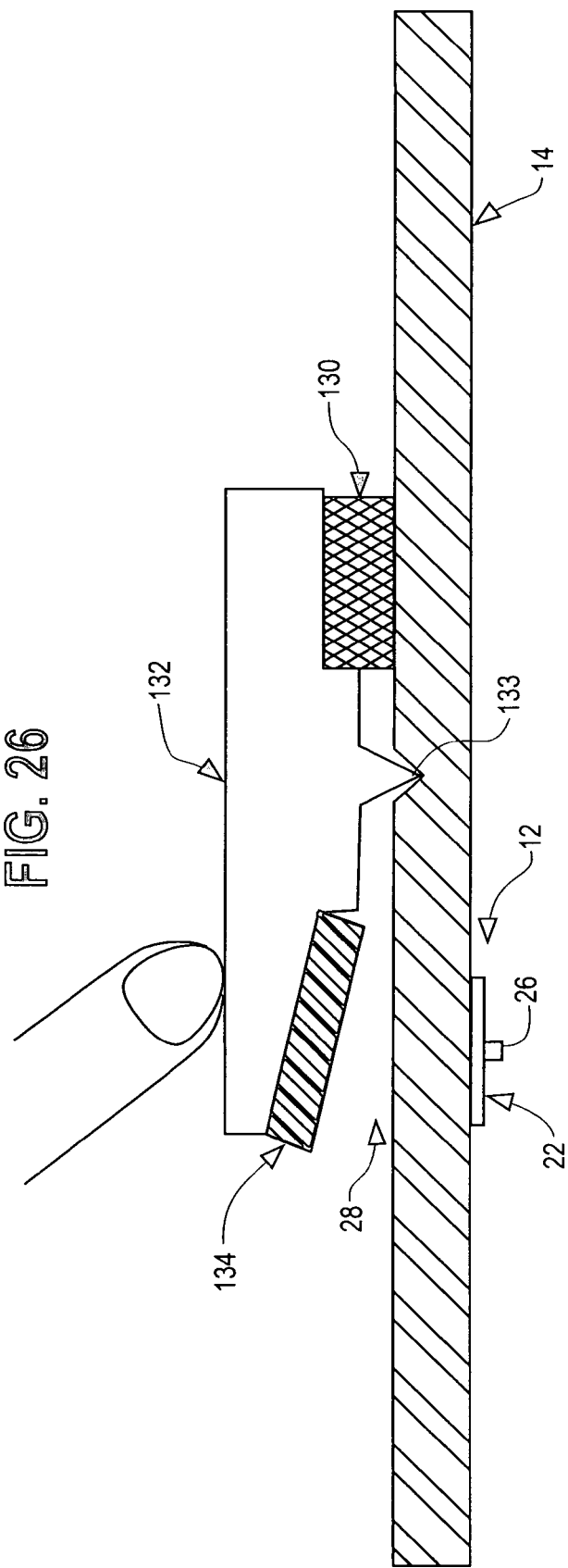
FIG. 26 is a cross-sectional view of a panel such as illustrated in FIG. 2 with a further embodiment of a mechanism for providing feedback to a user.

FIG. 26 provides tactile feedback of switch actuation using a rocker 132 having a magnet 130 mounted on a surface of the rocker 132 on a first side of a pivot point 133 and having an acoustic wave absorber 134 mounted on a surface of the rocker 132 on a second side of the pivot point 133. The magnet 130 is held against a substrate 14 formed of a steel plate or the like, so as to maintain the switch in an punctuated state. When the force on the rocker 132 above the absorber 134 overcomes a threshold, the rocker 132 pivots about the point 133 so that the acoustic wave absorber 134 contacts the touch surface 28 of the acoustic wave switch 12 so as to actuate the switch. Upon release of the rocker end above the absorber, the magnet 130 is attracted to the steel substrate 14 so as to return the rocker 132 to the punctuated switch position.

FIG. 27 illustrates another embodiment that provides feedback of switch actuation using a plunger 140 that extends through an aperture 144 in a steel plate 146. The plunger is held in an punctuated position above the touch surface 28 of an acoustic wave switch 12 by magnets 142 that are mounted on a flange 148 of the plunger. In the punctuated position, the magnets 142 are held against the steel plate 146 which is spaced above the substrate 14 by a sufficient distance so that an acoustic wave absorber 149 mounted on an end of the plunger 140 does not contact the touch surface 28 in an punctuated switch position. When a force is applied to the top of the plunger 140, overcoming the holding force of the magnets 142, the plunger moves downward so that the absorber 149 contacts the touch surface 28 actuating the switch. When the plunger 140 is released, the magnets 142 are attracted back to the steel plate 146 to return the plunger back to the punctuated position as shown in FIG. 27.

FIG. 28 illustrates an embodiment to provide feedback with no mechanism overlying the touch surface 28. In this embodiment, a solenoid 150 is mounted on a back surface of the substrate 14. When a touch on a surface 28 is detected as discussed above, current is applied to the solenoid 150. When current is applied to the solenoid 150, a rod 152 of iron, steel or the like, forming a striker is moved upward hitting the substrate 14 with sufficient force so that a finger on a nearby touch surface 28 feels motion or vibration of the substrate 14. The impact of the rod 152 against the substrate 14 can also provide audible feedback as well if desired. It is noted that the substrate 14 acts as a load spreader so that the substrate motion on impact by the rod 152 is not localized. As such, one solenoid can provide feedback for a number of acoustic wave switches formed on the substrate 14.

Because the acoustic wave cavity of the switch 12 in accordance with the present invention is formed at least in part integrally with the substrate 14, the switch 12 can be readily incorporated into a wall of a housing for a device. As such, the switch 12 is extremely rugged and does not have any sealing problems. The acoustic wave switch 12 utilizing a shear wave is insensitive to liquids and other contaminants on the touch surface 28 so that it is operable in the presence of liquids and other contaminants. Moreover, the switch 12 is explosion proof. The high Q of the switch 12 enables a touch to be detected by extremely simple, inexpensive circuitry. It should be apparent that touch detection circuits other than the oscillator circuit depicted in the drawings can be used with the acoustic wave switch of the present invention. Moreover, the switch has a low enough power consumption to be suitable for portable or hand held devices. Although the switch 12 has been described above with indicia 16 to identify the position of the switch, by eliminating the indicia, a covert switch is provided.

Many modifications and variations of the present invention are possible in light of the above teachings. For example, the cut-off frequency of the cavity region can be made less than the adjacent area surrounding the cavity by other methods than described herein. Thus, it is to be understood that, within the scope of the appended claims, the invention may be practiced otherwise than as described hereinabove.

What is claimed and desired to be secured by Letters Patent is:

1. A feedback mechanism for an acoustic wave switch having a touch sensitive surface comprising:
   a deformable dome overlying the touch sensitive surface of the acoustic wave switch, the dome in an unactuated position being spaced from the touch sensitive surface of the switch; and
   an acoustic wave absorbing material disposed between the deformable dome and the touch sensitive surface such that in response to a force acting on the dome, the dome deforms and contacts the absorbing material and the absorbing material contacts the touch sensitive surface of the acoustic wave switch with sufficient pressure to actuate the acoustic wave switch.

2. A feedback mechanism for an acoustic wave switch as recited in claim 1 wherein the acoustic wave absorbing material is mounted on a surface of the dome.

3. A feedback mechanism for an acoustic wave switch as recited in claim 1 wherein the acoustic wave absorbing material overlies the touch surface of the switch and is spaced from a surface of the dome in the unactuated position of the dome.

4. A feedback mechanism for an acoustic wave switch having a touch sensitive surface comprising:
   an actuator overlying the touch sensitive surface of the acoustic wave switch and an acoustic wave absorbing material mounted on the actuator, the acoustic wave absorbing material being spaced from the touch sensitive surface of the acoustic wave switch when the actuator is in an unactuated position and the acoustic wave absorbing material contacting the touch sensitive surface of the switch actuating the acoustic wave switch in response to a force acting on the actuator to move the acoustic wave absorbing material into actuating contact with the touch sensitive surface of the acoustic wave switch.

5. A feedback mechanism for an acoustic wave switch as recited in claim 4 wherein the actuator is a deformable dome.

6. A feedback mechanism for an acoustic wave switch as recited in claim 5 wherein the deformable dome is a truncated dome.

7. A feedback mechanism for an acoustic wave switch as recited in claim 4 wherein the actuator includes a plunger extending through an aperture in a metal plate spaced from the touch sensitive surface of the acoustic wave switch, the absorber being mounted on a bottom surface of the plunger and further including at least one magnet mounted on the plunger between the absorber and the metal plate to hold the actuator in the unactuated position.

8. A feedback mechanism for an acoustic wave switch having a touch sensitive surface comprising:
   an actuator overlying the touch sensitive surface of the acoustic wave switch and an acoustic wave absorbing material mounted on the actuator, the acoustic wave absorbing material being spaced from the touch sensitive surface of the acoustic wave switch when the actuator is in an unactuated position and the acoustic wave absorbing material contacting the touch sensitive surface of the switch actuating the acoustic wave switch in response to a force acting on the actuator to move the acoustic wave absorbing material into actuating contact with the touch sensitive surface of the acoustic wave switch, wherein the actuator includes a rocker having a pivot with a magnet mounted on the rocker on a first side of the pivot to hold the actuator in an unactuated position and the magnet returns the actuator to the unactuated position when the force is removed.

* * * * *